United States Patent
Jayaraj et al.

(10) Patent No.: US 12,423,492 B2
(45) Date of Patent: Sep. 23, 2025

(54) RECONFIGURABLE INLET POWER FEED AND INTEGRATED CIRCUIT POWER

(71) Applicant: Intel Corporation, Santa Clara, CA (US)

(72) Inventors: Navneeth Jayaraj, Bangalore (IN); Chetan Maheshwari, Bangalore (IN); Reed Vilhauer, Portland, OR (US); Dustin Fredrickson, Raleigh, NC (US)

(73) Assignee: Intel Corporation, Santa Clara, CA (US)

( * ) Notice: Subject to any disclaimer, the term of this patent is extended or adjusted under 35 U.S.C. 154(b) by 853 days.

(21) Appl. No.: 17/484,647

(22) Filed: Sep. 24, 2021

(65) Prior Publication Data

US 2022/0012396 A1    Jan. 13, 2022

(51) Int. Cl.
*G06F 30/34* (2020.01)

(52) U.S. Cl.
CPC .................................. *G06F 30/34* (2020.01)

(58) Field of Classification Search
USPC ........................................................ 716/117
See application file for complete search history.

(56) References Cited

U.S. PATENT DOCUMENTS

| | | | | |
|---|---|---|---|---|
| 5,841,993 A | * | 11/1998 | Ho | H04S 3/00 381/20 |
| 2014/0380069 A1 | * | 12/2014 | Berke | G06F 1/32 713/320 |
| 2018/0026643 A1 | * | 1/2018 | Crotty | H03K 19/17744 326/40 |

* cited by examiner

*Primary Examiner* — Bryce M Aisaka
(74) *Attorney, Agent, or Firm* — Fletcher Yoder, P.C.

(57) ABSTRACT

Systems and methods described herein may relate to power inlet reconfiguration of an integrated circuit device. In an embodiment, an add in card includes an integrated circuit including programmable logic circuitry. The add in card also includes any number of voltage regulators configured to supply power to the integrated circuit and a controller. The controller configures the programmable logic circuitry based on a configuration profile, determine a power level associated with the configuration profile, and adjust the plurality of voltage regulators and load switches based on the power level.

20 Claims, 7 Drawing Sheets

RECONFIGURABLE INLET POWER FEED AND INTEGRATED CIRCUIT POWER

BACKGROUND

The present disclosure relates to integrated circuit (IC) devices such as programmable logic devices (PLDs). More particularly, the present disclosure relates to power reconfiguration for an integrated circuit device, such as a field programmable gate array (FPGA), application specific integrated circuit (ASIC), and so forth.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuit devices are found in a wide variety of products, including computers, handheld devices, industrial infrastructure, televisions, and vehicles. Many of these integrated circuit devices are application-specific integrated circuits (ASICs) that are designed and manufactured to perform specific tasks. A programmable logic device such as an FPGA, by contrast, may be configured after manufacturing with a variety of different system designs. As such, programmable logic devices may be used for varying tasks and/or workloads. However, static power feeds for the programmable logic devices may result in inefficient power distribution for certain workloads.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical exclusive-OR (XOR)). In other words, the phrase A "or" B is intended to mean A, B, or both A and B.

Programmable logic devices are increasingly permeating markets and are increasingly enabling customers to implement circuit designs in logic fabric (e.g., programmable logic). Programmable logic fabric of an integrated circuit device may be programmed to implement a programmable circuit design to perform a wide range of functions and operations. The programmable logic fabric may include configurable blocks of programmable logic (e.g., sometimes referred to as logic array blocks (LABs) or configurable logic blocks (CLBs)) that have lookup tables (LUTs) that can be configured to operate as different logic elements based on the configuration data programmed into memory cells in the blocks.

Due to the highly customizable nature of programmable logic devices, the logic fabric can be configured with a circuit design for any number of different tasks and/or workloads. For example, a circuit design implemented in a portion of programmable logic may be utilized in a server. The programmable logic device may be a component of an add in card. The add in card may receive power from a number of inlet power feeds and load switches and voltage regulators of the add in card may distribute power to the programmable logic device. As programmable logic device applications have become ever more prevalent, there is a growing desire for efficient power design. By reconfiguring the power feed to the programmable logic device based on the implemented circuit design, more efficient power distribution may be realized.

Figure 1:
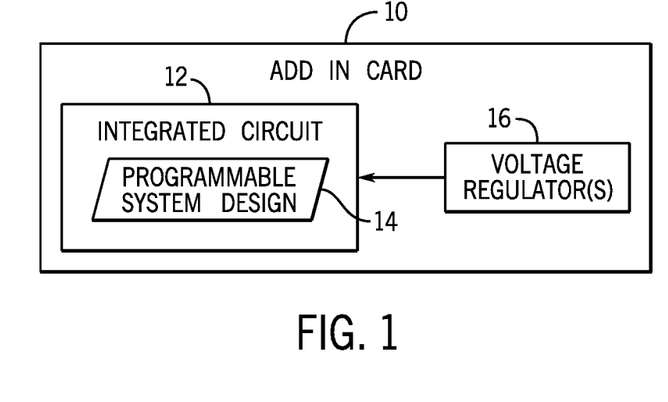
FIG. 1 is a block diagram of an add in card including an integrated circuit, in accordance with an embodiment.

With the foregoing in mind, FIG. 1 illustrates a block diagram of an add in card 10 that may implement operations. A designer may desire to implement functionality, such as the operations of this disclosure, on an integrated circuit 12 (e.g., a programmable logic device such as a field-programmable gate array (FPGA) or an application-specific integrated circuit (ASIC)). The integrated circuit 12 may implement a programmable system design 14 to carry out the desired functionality. In some cases, the designer may specify a high-level program to be implemented, such as an OPENCL® program, which may enable the designer to more efficiently and easily provide programming instructions to configure a set of programmable logic cells for the integrated circuit 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software, such as a version of INTEL® QUARTUS® by INTEL CORPORATION. The design software may use a compiler to convert the high-level program into a lower-level description. The compiler may provide machine-readable instructions representative of the high-level program to a host and the integrated circuit 12. The host may receive a host program which may be implemented by the kernel programs. To implement the host program, the host may communicate instructions from the host program to the integrated circuit 12 via a communications link, which may be, for example, direct memory access (DMA) communications or peripheral component interconnect express (PCIe) communications. In some embodiments, the kernel programs and the host may enable configuration of a logic block on the integrated circuit 12. The logic block may include circuitry and/or other logic elements and may be configured to implement arithmetic operations, such as addition and multiplication.

The designer may use the design software to generate and/or to specify a low-level program, such as the low-level hardware description languages described above. Further, in some embodiments, the system may be implemented without a separate host program. Moreover, in some embodiments, the techniques described herein may be implemented in circuitry as a non-programmable circuit design. Thus, embodiments described herein are intended to be illustrative and not limiting. The add in card 10 may also include any number of voltage regulators 16. The voltage regulators 16 may distribute voltage from an external power supply to the integrated circuit 12. In certain embodiments, the programmable system design 14 may have a corresponding power level based on the desired functionality, an application workload, the number and type of interfaces active, or a maximum integrated circuit power level, or any combination thereof. As such, the voltage regulators 16 may be configured according to the corresponding power level of the programmable system design in order to more efficiently distribute power.

Figure 2:
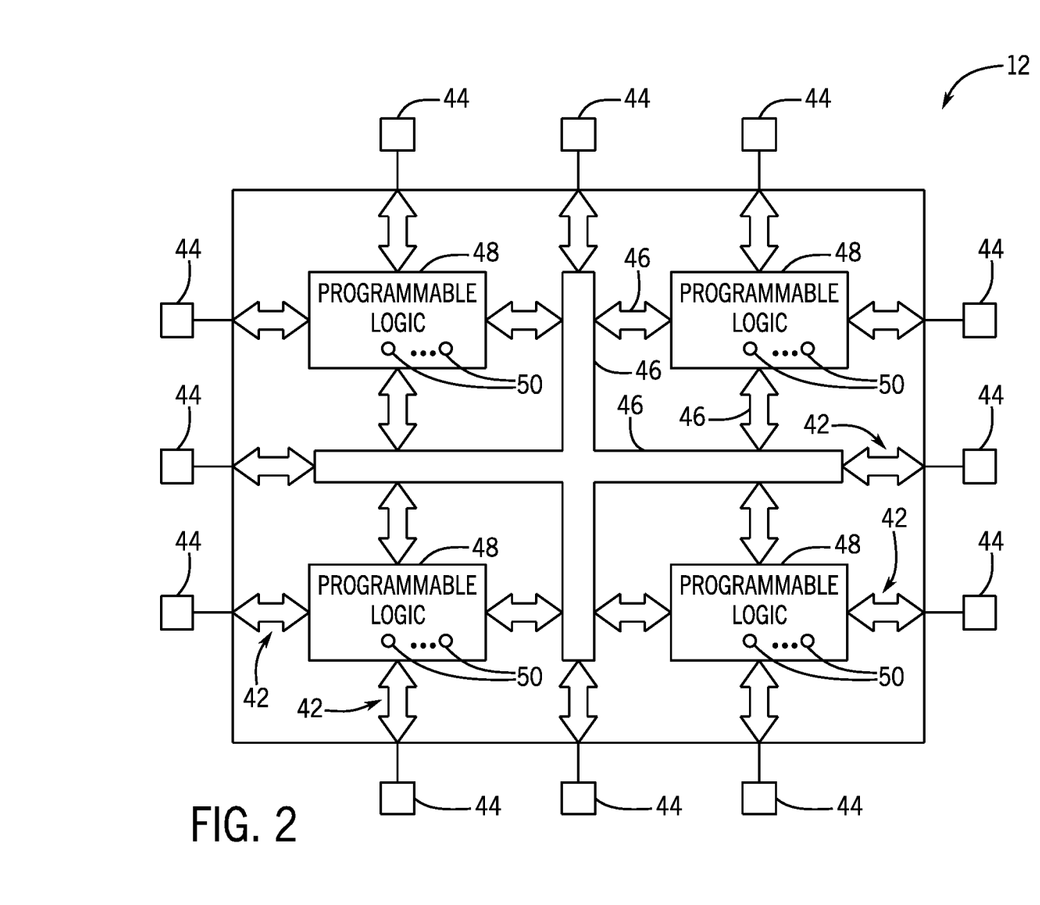
FIG. 2 is a block diagram of the integrated circuit of FIG. 1, in accordance with an embodiment.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). The integrated circuit 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements 50, such as configuration random-access-memory (CRAM) cells loaded with configuration data during programming and look-up table random-access-memory (LUTRAM) cells that may store either configuration data or user data, with the programmable logic 48. For example, as discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology is described herein is intended to be only one example. These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the discussion of FIG. 1 and FIG. 2 in mind, a user (e.g., designer) may utilize the design software to implement the logic block on the programmable logic 48 of the integrated circuit 12. In particular, the designer may specify in a high-level program that mathematical operations such as addition and multiplication be performed. The compiler may convert the high-level program into a lower-level description that is used to program the programmable logic 48 to perform addition and multiplication. Once programmed, the operations of the integrated circuit 12 and the circuit design may be debugged by sampling and analyzing data from the operations.

Figure 3:
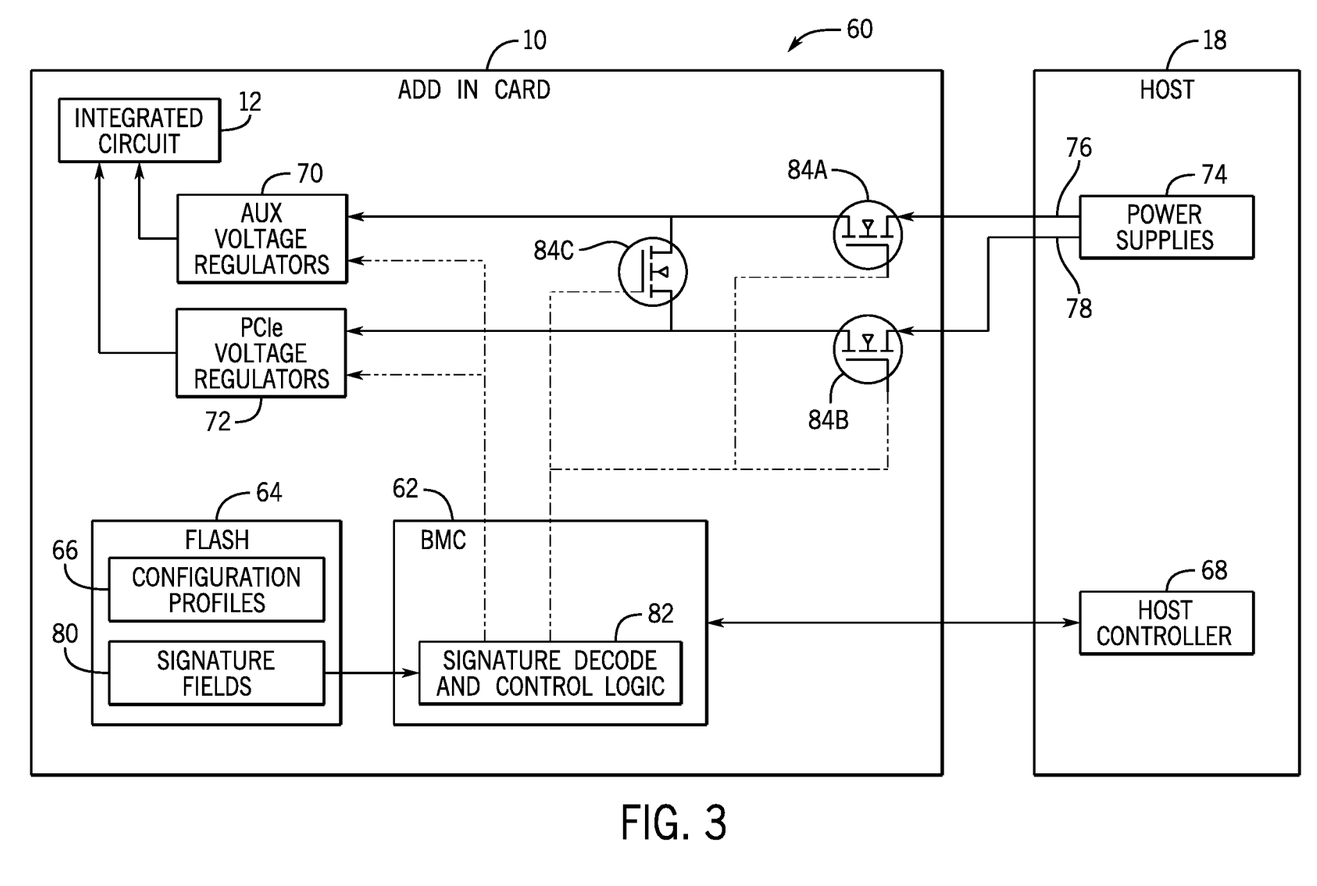
FIG. 3 is a block diagram of a system including the add in card of FIG. 1, in accordance with an embodiment.

The integrated circuit 12 may be an FPGA implementing a circuit design for acceleration of a specific task and/or workload. In order to provide efficient power distribution, components of the add in card may be configured based on the circuit design of the FPGA (e.g., configuration profile). FIG. 3 is a block diagram of a system 60 including the add in card 10 and a host 18, such as a server. The add in card 10 may include a board management controller 62 that may load the circuit design onto the programmable logic device and may manage voltage regulators and other components of the add in card 10, as described further herein. The board management controller (BMC) 62 may receive and/or retrieve from flash memory 64 any number of configuration profiles 66. The configuration profiles 66 may be bitstreams, each configuration profile corresponding to an application specific workload. In certain embodiments, a host controller 68 may request reconfiguration of a programmable logic device according to a specific workload. For example, the host controller 68 may transmit the request to the board management controller 62 and the board management controller 62 may select an appropriate configuration profile 66 from the flash memory 64 based on the specific workload (e.g., the request).

The add in card 10 may also include voltage regulators connected to one of an aux connector power supply rail 76 and a peripheral component interconnect express (PCIe) edge connector power supply rail 78, such as aux voltage regulators 70 and PCIe voltage regulators 72. The board management controller 62 may control operation of the aux voltage regulators 70 and the PCIe voltage regulators 72. The aux voltage regulators 70 and PCIe voltage regulators 72 may supply power to the programmable logic device. For example, the board management controller 62 may control power distribution from the power supply 74 via the aux connector power supply rail 76 and/or PCIe edge connector power supply rail 78 to the aux voltage regulators 70 and/or PCIe voltage regulators 72. In certain embodiments, the aux connector power supply rail 76 may be connected to the aux voltage regulators 70 and the PCIe edge connector power supply rail 78 may be connected to the PCIe voltage regulator 72. The aux connector power supply rail 76 and PCIe edge connector power supply rail 78 may supply up to 100 watts of power each (e.g., up to 25 watts, up to 50 watts, up to 75 watts, and so forth).

The flash memory 64 may also include any number of signature fields 80. Each signature field 80 may be generated and may be associated with a corresponding configuration profile 66. In certain embodiments, the signature field 80 may include a header having any number of bytes. For example, the signature field 80 may include a 16-byte header, 32-byte header, 64-byte header, and so forth. The signature field 80 may include any number of parameters associated with the corresponding configuration profile 66. For example, the signature field 80 may include programmable logic power, add in card power, memory interface count, network interface count, and so forth. In some embodiments, the signature field 80 may be generated by the design software. The board management controller 62 may receive and/or may retrieve the signature field 80 from the flash memory 64 and may include signature decode and control logic 82. The signature decode and control logic 82 may decode the signature field 80 and may configure components of the add in card 10 based on the decoded signature field 80. For example, the board management controller 62 may generate instructions based on the decoded signature field 80 and may control any number of load switches, such as load switches 84A, 84B, 84C, to distribute power from the aux connector power supply rail 76 and PCIe edge connector power supply rail 78. For example, the configuration profile 66 implemented on the integrated circuit of the add in card 10 may require power equivalent to or less than may be supplied from one of the power inlet connectors 76, 78. As such, the board management controller 62 may disable one of the power inlet connectors (e.g., aux connector power supply rail 76). Additionally or alternatively, the board management controller 62 may transmit a signal to the host 18 indicating the power from the aux connector power supply rail 76 may be redirected to other components. In certain embodiments, the load switches 84A, 84B, 84C may be field effect transistors and the load switches 84A, 84B, 84C may adjustably couple the power inlet connectors 76, 78 to the integrated circuit 12. Each load switch may have a gate terminal coupled to the board management controller 62. As such, the board management controller 62 may control operation of the load switches 84A, 84B, 84C. A first load switch 84A may receive and distribute power from the aux connector power supply rail 76. For example, the first load switch 84A may distribute power from the aux connector power supply rail 76 to the aux voltage regulators 70. A second load switch 84B and a third load switch 84C may receive and distribute power from the PCIe edge connector power supply rail 78. For example, the second load switch 84B and the third load switch 84C may distribute power from the PCIe edge connector power supply rail 78 to PCIe voltage regulators 72 and the aux voltage regulators 70, respectively. In some embodiments, the third load switch 84C may distribute power from the PCIe edge connector power supply rail 78 to the aux voltage regulators 70 when the aux connector power supply rail 76 is disabled.

Figure 4:
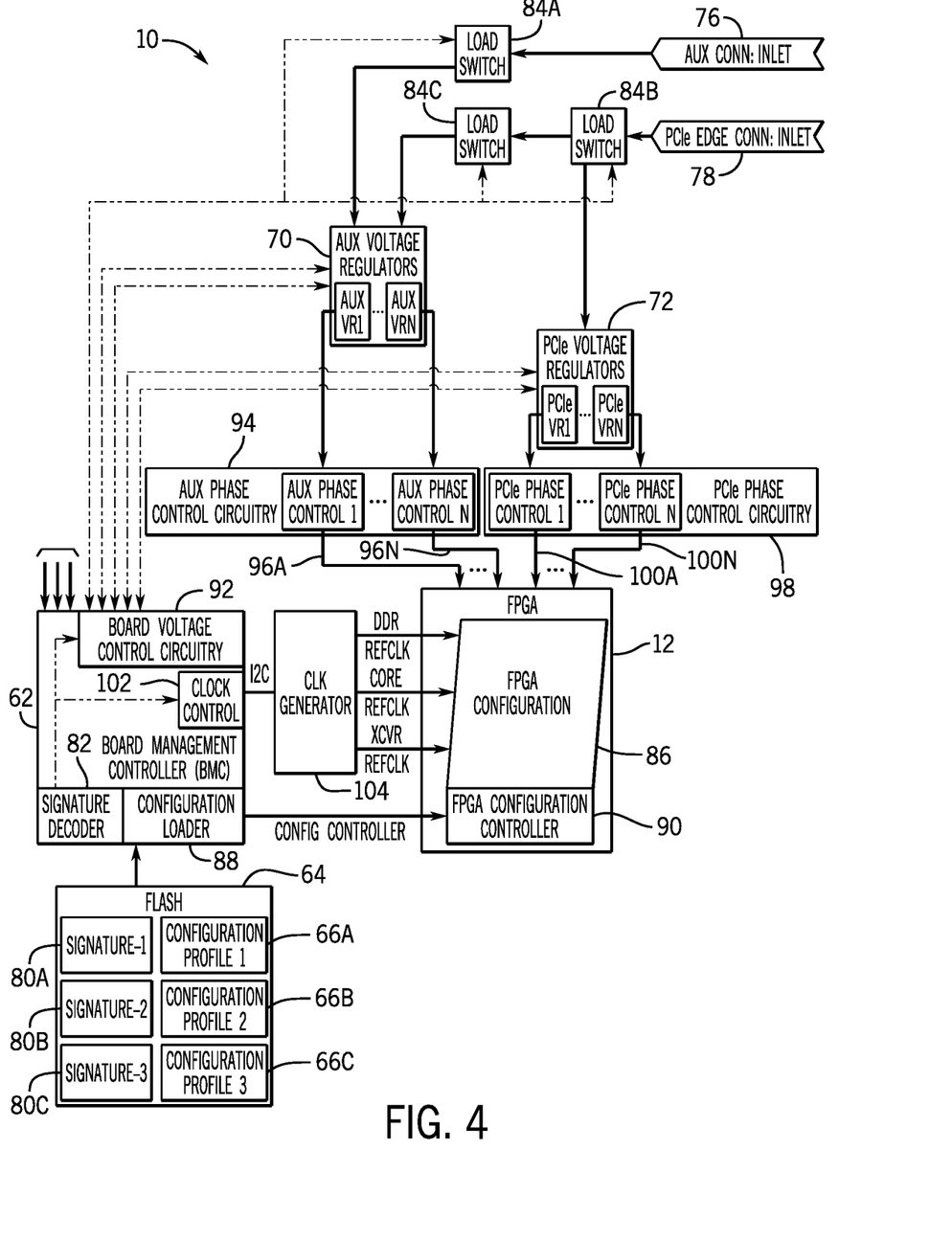
FIG. 4 is a block diagram of the add in card of FIG. 1, in accordance with an embodiment.

When configuring an integrated circuit with a configuration profile, the configuration profile may have specific power requirements. Reconfiguration of power distribution according to the specific power requirements of the configuration profile may increase power efficiency. With the foregoing in mind, FIG. 4 illustrates a block diagram of the add in card 10, in accordance with an embodiment of the present disclosure. The integrated circuit 12 may implement a FPGA configuration 86 corresponding to a configuration profile. For example, the flash memory 64 may include a number of configuration profiles, such as configuration profiles 66A, 66B, 66C. A configuration loader 88 of the board management controller 62 may receive and/or retrieve a configuration profile 66 from the flash memory 64 and may configure the integrated circuit 12 with the FPGA configuration 86 corresponding to the configuration profile. The board management controller 62 may transmit the bitstream to the integrated circuit 12 and the integrated circuit configuration controller 90 may implement the FPGA configuration 86 according to the bitstream and may configure the integrated circuit 12.

The board management controller 62 may also determine power required for the selected configuration profile. For example, the first configuration profile 66A may be a low power configuration profile and may require power equal to or less than the power supplied from a single power inlet connector 76, 78. For example, the PCIe connector 78 may supply up to 100 watts of power (e.g., up to 25 watts, up to 50 watts, up to 75 watts). In certain embodiments, the first configuration profile 66A may require power equal to 50 watts. As such, power from the aux connector power supply rail 76 may not be necessary for implementation of the first configuration profile 66A on the integrated circuit 12. Additionally or alternatively, the second configuration profile 66B may be a high power configuration profile and may require power greater than the power supplied from a single power inlet connector 76, 78. In some embodiments, the second configuration profile 66B may require power equal to 110 watts. As such, implementation of the second configuration profile 66B on the integrated circuit 12 may require power from the aux connector power supply rail 76 and the PCIe connector 78. Additionally or alternatively, the third configuration profile 66C may be a low power configuration profile and may be a backup configuration profile. For example, the third configuration profile 66C may require power equal to 40 watts. As such, power from the aux connector power supply rail 76 may not be necessary for implementation of the third configuration profile 66C on the integrated circuit 12.

Once the configuration profile 66 has been selected based on the application workload (e.g., the request), the board management controller 62 may reconfigure the power inlet connectors 76, 78, the voltage regulators 70, 72, and the load switches 84A, 84B, 84C based on the selected configuration profile 66. The board management controller 62 may receive and/or retrieve a corresponding signature field 80 based on the selected configuration profile 66. For example, if the first configuration profile 66A is selected, then the board management controller 62 may receive the first signature field 80A. The first signature field 80A may include data associated with the first configuration profile 66A, as depicted in Table 1. For example, each signature field 80 may include a preamble data field. The preamble data field may indicate the start of the signature field 80 to the signature decode and control logic 82. Each signature field 80 may also include a card power bracket data field. The card power bracket data field may indicate a high power level or low power level for the configuration profile. For example, the card power bracket data field for the first configuration profile 66A may indicate the first configuration profile 66A is a low power level configuration profile. The maximum integrated circuit power data field may indicate a worst case power scenario for the configuration profile. The typical integrated circuit power data field may indicate a typical operating power for the configuration profile. The minimum integrated circuit power data field may indicate an operating power for the configuration profile associated with optimal cooling of the integrated circuit 12. The interface type and count data field may indicate the types and counts of network interfaces and external memory interfaces enabled for the configuration profile. The checksum data field may be used to validate the signature field 80. For example, the board management controller 62 may compute a checksum of the first signature field 80A and may compare the computed checksum with the checksum data field. In certain embodiments, the board management controller 62 may validate the signature field 80 prior to configuration of the integrated circuit 12 and configuration of additional components of the add in card 10. While Table 1 includes a preamble data field, card power bracket data field, max integrated circuit power data field, typical integrated circuit power data field, minimum integrated circuit power data field, interface type and count data field, and checksum data field, any number of data fields may be included in signature field 80. For example, signature field 80 may include any combination of the data fields in Table 1 and/or any additional data fields.

TABLE 1

FIELDS

Preamble
Card Power Bracket
Max Integrated Circuit Power
Typical Integrated Circuit Power
Minimum Integrated Circuit Power
Interface Type and Count
Checksum The board management controller 62 may decode the signature field 80 and may determine settings for components of the add in card 10 based on the decoded signature field 80. The board management controller 62 may include board voltage control circuitry 92. In certain embodiments, the board voltage control circuitry 92 may control the inlet feed connectors 76, 78 based on the card power bracket data field (e.g., low power configuration profile, high power configuration profile). For example, the board voltage control circuitry 92 may control operation of the load switches 84A, 84B, 84C to distribute power from the inlet feed connectors 76, 78. In certain embodiments, the board management controller 62 may determine the configuration profile is a low power configuration profile (e.g., first configuration profile 66A) based on the decoded signature field. Accordingly, the board management controller 62 may disable the aux connector power supply rail 76 and may transmit a signal to the host 18 indicating the power for the aux connector power supply rail 76 may be redirected to other components. For low power configuration profiles (e.g., first configuration profile 66A, third configuration profile 66C), the board voltage control circuitry 92 may generate and transmit a signal to open the first load switch 84A. As such, the board voltage control circuitry 92 may disable operation of the aux connector power supply rail 76. Additionally, the board voltage control circuitry 92 may generate and transmit a signal to close the second load switch 84B and the third load switch 84C. Accordingly, the third load switch 84C may redirect and distribute power from the PCIe edge connector power supply rail 78 to the aux voltage regulators 70. For high power configuration profiles (e.g., second configuration profile 66B), the board voltage control circuitry 92 may generate and transmit a signal to close the first load switch 84A. As such, the first load switch 84A may distribute power from the aux connector power supply rail 76 to the aux voltage regulators 70. Additionally, the board voltage control circuitry 92 may generate and transmit a signal to close the second load switch 84B and open the third load switch 84C. Accordingly, the second load switch 84B may distribute power from the PCIe edge connector power supply rail 78 to the PCIe voltage regulators 72.

Additionally or alternatively, the board voltage control circuitry 92 may control operation of the voltage regulators 70, 72 based on the configuration profile and decoded signature field. In some embodiments, the aux voltage regulators 70 may include any number of aux voltage regulators and the PCIe voltage regulators 72 may include any number of PCIe voltage regulators. The add in card 10 may also include aux phase control circuitry 94 coupled to any number of aux voltage rails 96A, 96N and PCIe phase control circuitry 98 coupled to any number of voltage rails 100A, 100N. Each of the aux voltage regulators 70 and each of the PCIe voltage regulators 72 may be a multi-phase regulator and each phase may have a corresponding power capability. For example, a three-phase voltage regulator may have a power capability for each phase of up to 30 watts (e.g., up to 20 watts, up to 15 watts, and so forth). Accordingly, the board voltage control circuitry 92 may control operation of the aux voltage regulators 70 and the PCIe voltage regulators 72 to enable and/or disable phases according to implemented configuration profile. In certain embodiments, the board voltage control circuitry 92 may receive data corresponding to the decoded signature field. For example, the board voltage control circuitry 92 may receive data corresponding to the first signature field 80A. In certain embodiments, the board voltage control circuitry 92 may determine a power level based on the first signature field 80A. The board voltage control circuitry 92 may determine the power level of the first configuration profile 66A based on the card power bracket, the maximum integrated circuit power, the typical integrated circuit power, or the minimum integrated circuit power, or any combination thereof. For example, the board voltage control circuitry 92 may determine the power level of the first configuration profile 66A is 35 watts. The board voltage control circuitry 92 may also determine the voltage regulators 70, 72 are three-phase voltage regulators and each phase may have up to a 20 watt power capability. As such, the board voltage control circuitry 92 may enable two phases of the voltage regulators 70, 72 and/or may disable one phase of the voltage regulators 70, 72 based on the power level of the first configuration profile 66A. For example, the board voltage control circuitry 92 may generate and may output a signal to the aux phase control circuitry 94 to enable any number of phases and/or disable any number of phases of the aux voltage regulators 70 according to the power level of the first configuration profile 66A. Additionally or alternatively, the board voltage control circuitry 92 may generate and may output a signal to the PCIe phase control circuitry 98 to enable any number of phases and/or disable any number of phases of the PCIe voltage regulators 72 according to the power level of the first configuration profile 66A.

In certain embodiments, the board management controller 62 may control operation of the voltage regulators 70, 72 based on the interface type and/or count. For example, the add in card 10 may include any number of memory and/or network interfaces coupled to the integrated circuit 12. Each configuration profile 66 may utilize any number of the memory interfaces and/or any number of the network interfaces. The board management controller 62 may determine the type and/or number of interfaces utilized based on the interface type and count data field of the signature field. In certain embodiments, the board management controller 62 may determine a power required based on the type and/or number of interfaces active for the corresponding configuration profile. Accordingly, the board management controller 62 may control operation (e.g., enable/disable phases) of the voltage regulators 70, 72 based on the type and/or number of active interfaces (e.g., memory, network, and so forth). In some embodiments, the board management controller 62 may include clock control circuitry 102. The clock control circuitry 102 may control operation of clock 104 of the add in card 10. The clock 104 may generate and transmit a clock signal to the integrated circuit 12.

Figure 5:
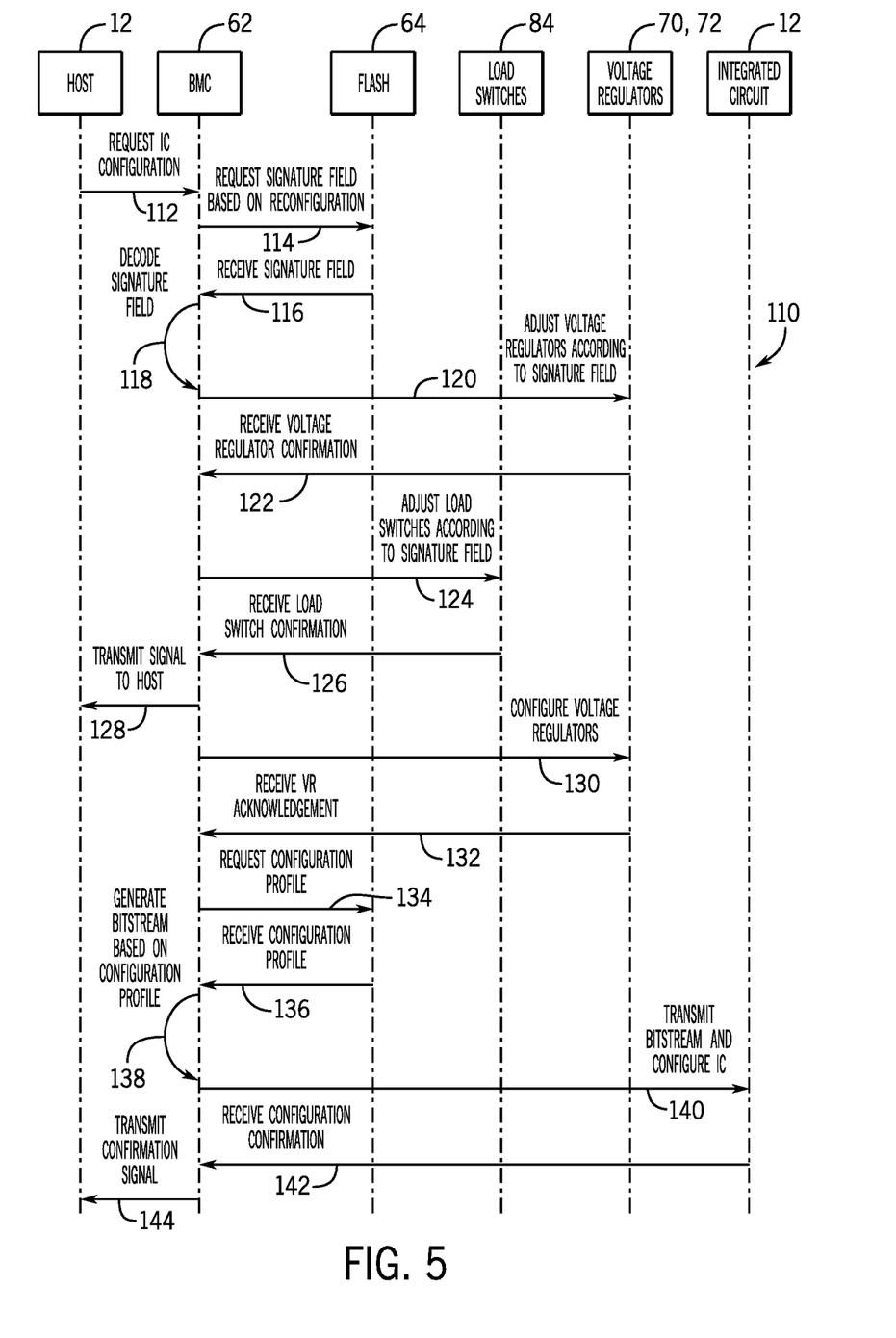
FIG. 5 is a flow diagram of a process for inlet power reconfiguration for an integrated circuit, in accordance with an embodiment.

With the foregoing in mind, FIG. 5 illustrates a flow diagram of a process 110 for inlet power reconfiguration for an integrated circuit, such as integrated circuit 12. While the process 110 is described using steps in a specific sequence, it should be understood that the present disclosure contemplates that the described steps may be performed in different sequences than the sequence illustrated, and certain described steps may be implemented by executing instructions stored in a tangible, non-transitory, computer-readable medium using any suitable processing circuitry.

The integrated circuit 12 may implement a configuration profile (e.g., second configuration profile 66B). In certain embodiments, the second configuration profile 66B may utilize aux connector power supply rail 76 and PCIe edge connector power supply rail 78. Additionally or alternatively, the second configuration profile 66B may utilize any number of phases (e.g., one, two, three, and so forth) of the voltage regulators 70, 72. In the process 110, the host 18 may request reconfiguration (numeral 112) of the integrated circuit 12 based on an application workload. For example, the host controller 68 may transmit the request and the board management controller 62 may receive the request via a communication interface. The board management controller 62 may determine and/or select a configuration profile 66 based on the request. For example, the integrated circuit 12 may request reconfiguration to the first configuration profile 66A. As such, the board management controller 62 may determine and/or select the first configuration profile 66A. At numeral 114, the board management controller 62 may request a corresponding signature field 80 based on the selected configuration profile 66. For example, the board management controller 62 may request the first signature field 80A associated with the first configuration profile 66A. At numeral 116, the board management controller 62 may receive the corresponding signature field 80 (e.g., the first signature field 80A).

The board management controller 62 may decode the signature field 80. For example, the signature decode and control logic 82 may determine a power level (e.g., low power level configuration profile, high power level configuration profile) of the associated configuration profile based on the signature field 80. Additionally or alternatively, the board management controller 62 may determine operation of the power inlet connectors 76, 78 based on the signature field 80. For example, the signature decode and control logic 82 may determine the power level of the associated configuration profile 66 is equal to or less than the power provided by the PCIe connector 78. As such, the board management controller 62 may determine the aux connector power supply rail 76 may be disabled. At numeral 120, the board management controller 62 may generate and transmit a signal to adjust operation of the voltage regulators 70, 72 based on the decoded signature field 80. For example, the board management controller 62 may generate a signal to shut off the voltage regulators 70, 72. At numeral 122, the board management controller 62 may receive a confirmation signal indicating the voltage regulators 70, 72 are shut off. For example, the board management controller 62 may determine no voltage is passing through the voltage regulators 70, 72.

At numeral 124, the board management controller 62 may control operation of the load switches 84A, 84B, 84C based on the signature field 80. In certain embodiments, the board voltage control circuitry 92 may generate and transmit a signal to the load switches 84A, 84B, 84C based on the power level of the associated configuration profile. For example, the board voltage control circuitry 92 may disable the aux connector power supply rail 76 for a low power level configuration profile (e.g., first configuration profile 66A, third configuration profile 66C). The board voltage control circuitry 92 may generate and transmit a signal to open the first load switch 84A and close the second load switch 84B and third load switch 84C. As such, the first load switch 84A may distribute power from the PCIe connector 78 to the PCIe voltage regulators 72 and the third load switch 84C. Additionally, the third load switch 84C may distribute power from the PCIe connector 78 to the aux voltage regulators 70. At numeral 126, the board management controller 62 may receive a confirmation signal indicating the load switches 84A, 84B, 84C are adjusted. For example, the board management controller 62 may determine no voltage is passing through the aux voltage rails 96A, 96N.

At numeral 128, the board management controller 62 may generate and transmit a signal to the host 18 indicating power to the aux connector power supply rail 76 may be turned off and/or rerouted to other components. Additionally or alternatively, the board management controller 62 may generate and transmit a signal to the host 18 indicating additional components (e.g., fans and so forth) may be turned off to reduce power consumption.

At numeral 130, the board management controller 62 may generate and transmit a signal to configure the voltage regulators 70, 72 based on the signature field 80. In certain embodiments, the board voltage control circuitry 92 may enable any number of phases and/or disable any number of phases of the voltage regulators 70, 72 based on the signature field 80. For example, the board management controller 62 may determine a power level (e.g., 35 watts) for the first configuration profile 66A and the voltage regulators 70, 72 may be multi-phase voltage regulators, each phase having a power capability of 20 watts. As such, the board voltage control circuitry 92 may enable two phases of the voltage regulators 70, 72 based on the determined power level. At numeral 132, the board management controller 62 may receive an acknowledgement signal from the voltage regulators 70, 72 after configuration of the voltage regulators 70, 72. For example, the BMC 62 may receive an acknowledgement signal indicative of the voltage regulators 70, 72 being enabled.

At numeral 134, the board management controller 62 may request the configuration profile (e.g., first configuration profile 66A) according to the reconfiguration request from the host 18. For example, the board management controller 62 may request the configuration profile 66 from the flash memory 64. At numeral 136, the board management controller may receive and/or may retrieve the configuration profile 66 from the flash memory 64. In certain embodiments, the configuration loader 88 may receive the configuration profile 66. At numeral 138, the board management controller 62 may generate a bitstream based on the configuration profile 66. In some embodiments, the configuration loader 88 may generate the bitstream based on the configuration profile 66 to be implemented on the integrated circuit 12. At numeral 140, the board management controller 62 may transmit the bitstream based on the configuration profile 66 and may configure the integrated circuit 12. In certain embodiments, the integrated circuit configuration controller 90 may receive the bitstream and may implement the bitstream image on the integrated circuit 12. At numeral 142, the board management controller 62 may receive a confirmation signal indicating the integrated circuit 12 has been configured according to the configuration profile 66. At numeral 144, the board management controller 62 may generate and/or may transmit the confirmation signal to the host 18.

Figure 6:
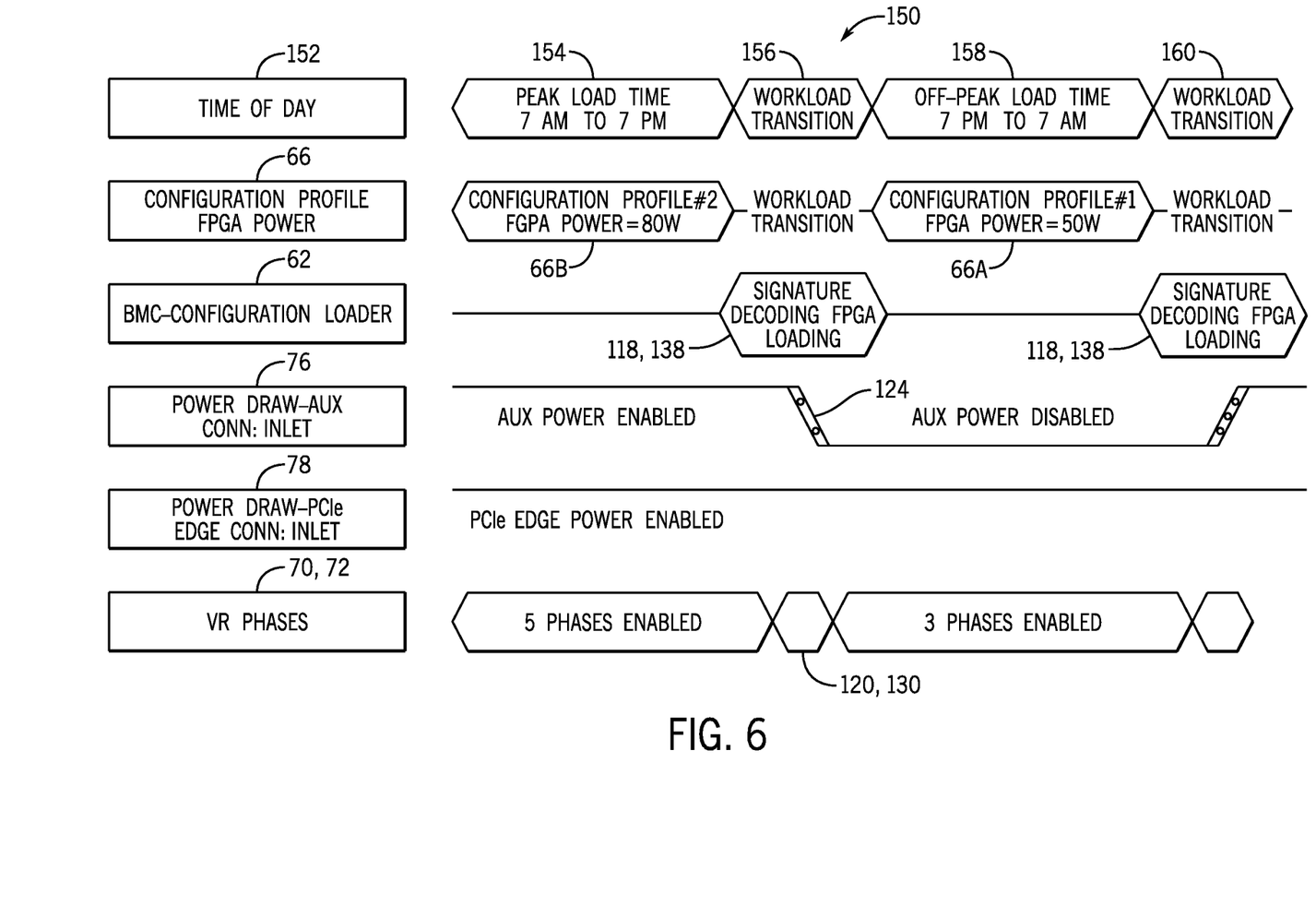
FIG. 6 is a timing diagram for the inlet power reconfiguration process of FIG. 5, in accordance with an embodiment.

With the foregoing in mind, FIG. 6 illustrates a timing diagram 150 for the process 110 of FIG. 5, in accordance with an embodiment of the present disclosure. The timing diagram 150 includes a time of day 152. The time of day 152 may include a peak load time 154, a first workload transition time 156, an off peak load time 158, and a second workload transition time 160. The peak load time 154 may correspond to a high power level configuration profile (e.g., the second configuration profile 66B) for the integrated circuit 12. The first workload transition time 156 may correspond to reconfiguration of the integrated circuit 12 from one configuration profile to another configuration profile. Additionally, the off peak load time 158 may correspond to a low power level configuration profile (e.g., the first configuration profile 66A, the third configuration profile 66C). The second workload transition time 160 may correspond to reconfiguration of the integrated circuit 12 (e.g., back to the original configuration profile, to still another configuration profile, and so forth). While only one peak load time, one off peak load time, and two workload transition times are illustrated in FIG. 6, it should be understood that the present disclosure contemplates any number of peak load times, off peak load times, and/or workload transition times. During the peak load time 154, the integrated circuit 12 may implement the second configuration profile 66B. Accordingly, both the aux connector power supply rail 76 and PCIe edge connector power supply rail 78 may be enabled. Additionally, five phases of the voltage regulators 70, 72 may be enabled. During the first workload transition time 156, the board management controller 62 may receive and/or retrieve the first configuration profile 66A and the first signature field 80A. The board management controller 62 may decode the first signature field 80A and may generate a bitstream based on the first configuration profile 66A. Additionally, the board management controller 62 may disable the aux connector power supply rail 76, as described herein. The board management controller 62 may also disable two phases of the voltage regulators 70, 72. As such, power efficiency may be increased by disabling the aux connector power supply rail 76 and/or phases of the voltage regulators 70, 72.

The integrated circuit device 12 may be a data processing system or a component included in a data processing system. For example, the integrated circuit device 12 may be a component of a data processing system 180 shown in FIG. 7. The data processing system 180 may include a host processor 182 (e.g., a central-processing unit (CPU)), memory and/or storage circuitry 184, and a network interface 186. The data processing system 180 may include more or fewer components (e.g., electronic display, user interface structures, application specific integrated circuits (ASICs)). The host processor 182 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 180 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 184 may include random access memory (RAM), read-only memory (ROM), one or more hard drives, flash memory, or the like. The memory and/or storage circuitry 184 may hold data to be processed by the data processing system 180. In some cases, the memory and/or storage circuitry 184 may also store configuration programs (bitstreams) for programming the integrated circuit device 12. The network interface 186 may allow the data processing system 180 to communicate with other electronic devices. The data processing system 180 may include several different packages or may be contained within a single package on a single package substrate.

Figure 7:
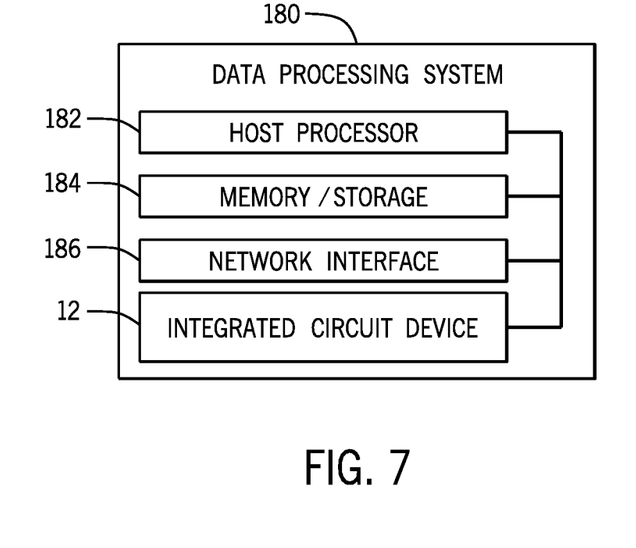
FIG. 7 is a data processing system, in accordance with an embodiment of the present disclosure.

In one example, the data processing system 180 may be part of a data center that processes a variety of different requests. For instance, the data processing system 180 may receive a data processing request via the network interface 186 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Accordingly, it should be understood that the disclosure is not intended to be limited to the particular forms disclosed. The disclosure is to cover all modifications, equivalents, and alternatives falling within the spirit and scope of the disclosure as defined by the following appended claims.

Technical effects of the present disclosure include system and methods that provide reconfiguration of components associated with inlet power for a programmable logic device. The techniques described herein may benefit operations of programmable logic devices, such as field programmable gate arrays and/or other configurable devices, by improving power efficiency.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS OF THE DISCLOSURE

The following numbered clauses define certain example embodiments of the present disclosure.
Clause 1.
 A system, comprising:
 a host configured to request a reconfiguration of an integrated circuit, the host comprising a power connector; and
  an add in card comprising:
  a first group of voltage regulators configured to supply power to the integrated circuit;
  a second group of voltage regulators configured to supply power to the integrated circuit;
  a load switch configured to adjustably couple the power connector to the first group of voltage regulators or the second group of voltage regulators;
  a controller configured to:
   receive the request and select a configuration profile based on the request;
   determine a power level associated with the configuration profile; and
   adjust the load switch based on the power level.
Clause 2.
The system of clause 1, comprising:
 a second load switch configured to adjustably couple a second power connector to the second group of voltage regulators; and
 a third load switch configured to couple the power connector to the first group of voltage regulators.
Clause 3.
 The system of clause 2, wherein the controller is configured to adjust the second load switch based on the power level.
Clause 4.
 The system of clause 1, wherein the controller is configured to determine a signature field associated with the request.
Clause 5.
 The system of clause 4, wherein the controller is configured to decode the signature field to determine the power level.
Clause 6.
 The system of clause 4, wherein the controller is configured to adjust the load switch based on the signature field.
Clause 7.
 The system of clause 4, wherein the signature field comprises a plurality of data fields associated with the configuration profile.
Clause 8.
 The system of clause 1, wherein the controller is configured to adjust operation of the first group of voltage regulators based on the power level.
Clause 9.
An add in card, comprising:
 an integrated circuit comprising programmable logic circuitry;
 a plurality of voltage regulators configured to supply power to the integrated circuit; and
 a controller configured to:
  configure the programmable logic circuitry based on a configuration profile;
  determine a power level associated with the configuration profile; and
  adjust the plurality of voltage regulators based on the power level.
Clause 10.
 The add in card of clause 9, wherein at least one voltage regulator of the plurality of voltage regulators is a multi-phase voltage regulator.
Clause 11.
 The add in card of clause 10, wherein the controller is configured to enable one or more phases of each voltage regulator based on the power level.
Clause 12.
 The add in card of clause 10, wherein the controller is configured to disable one or more phases of each voltage regulator based on the power level.
Clause 13.
The add in card of claim 9, comprising:
 a second plurality of voltage regulators configured to supply power to the integrated circuit; and
 a plurality of load switches, each load switch configured to distribute power to at least one of the plurality of voltage regulators and the second plurality of voltage regulators.
Clause 14.
 The add in card of clause 13, wherein the controller is configured to adjust at least one load switch of the plurality of load switches based on the power level.
Clause 15.
 The add in card of clause 14, wherein the controller is configured to adjust the at least one load switch to decouple from the plurality of voltage regulators and couple to the second plurality of voltage regulators.
Clause 16.
 The add in card of clause 14, wherein the controller is configured to close the at least one load switch based on the power level.
Clause 17.
A method comprising:
 receiving a request for reconfiguration of a programmable logic device on an add in card;
 determining a configuration profile for the programmable logic device based on the request;
 receiving a signature field based on the configuration profile;

determining a power level associated with the configuration profile based on the signature field; and adjusting one or more components of the add in card based on the power level.

Clause 18.

The method of clause 17, comprising:

determining the power level is a low power level based on the signature field; and disabling an inlet power feed based on the low power level.

Clause 19.

The method of clause 17, determining a power level associated with the configuration profile based on the signature field comprising decoding the signature field.

Clause 20.

The method of clause 17, comprising adjusting one or more voltage regulators of the add in card based on the power level.

What is claimed is:

1. A system, comprising:
a host configured to request a reconfiguration of an integrated circuit, the host comprising a power connector; and
an add in card comprising:
a first group of voltage regulators configured to supply power to the integrated circuit;
a second group of voltage regulators configured to supply power to the integrated circuit;
a load switch configured to adjustably couple the power connector to the first group of voltage regulators or the second group of voltage regulators;
a controller configured to:
receive the request and select a configuration profile based on the request;
determine a power level associated with the configuration profile; and
adjust the load switch based on the power level.

2. The system of claim 1, comprising:
a second load switch configured to adjustably couple a second power connector to the second group of voltage regulators; and
a third load switch configured to couple the power connector to the first group of voltage regulators.

3. The system of claim 2, wherein the controller is configured to adjust the second load switch based on the power level.

4. The system of claim 1, wherein the controller is configured to determine a signature field associated with the request.

5. The system of claim 4, wherein the controller is configured to decode the signature field to determine the power level.

6. The system of claim 4, wherein the controller is configured to adjust the load switch based on the signature field.

7. The system of claim 4, wherein the signature field comprises a plurality of data fields associated with the configuration profile.

8. The system of claim 1, wherein the controller is configured to adjust operation of the first group of voltage regulators based on the power level.

9. An add in card, comprising:
an integrated circuit comprising programmable logic circuitry;
a plurality of voltage regulators configured to supply power to the integrated circuit; and
a controller configured to:
identify a selected configuration profile from among a plurality of configuration profiles based on a request from a host;
instruct the integrated circuit to configure the programmable logic circuitry based on the selected configuration profile;
determine a power level associated with the selected configuration profile; and
adjust the plurality of voltage regulators based on the power level.

10. The add in card of claim 9, wherein at least one voltage regulator of the plurality of voltage regulators is a multi-phase voltage regulator.

11. The add in card of claim 10, wherein the controller is configured to enable one or more phases of each voltage regulator based on the power level.

12. The add in card of claim 10, wherein the controller is configured to disable one or more phases of each voltage regulator based on the power level.

13. The add in card of claim 9, comprising:
a second plurality of voltage regulators configured to supply power to the integrated circuit; and
a plurality of load switches, each load switch configured to distribute power to at least one of the plurality of voltage regulators and the second plurality of voltage regulators.

14. The add in card of claim 13, wherein the controller is configured to adjust at least one load switch of the plurality of load switches based on the power level.

15. The add in card of claim 14, wherein the controller is configured to adjust the at least one load switch to decouple from the plurality of voltage regulators and couple to the second plurality of voltage regulators.

16. The add in card of claim 14, wherein the controller is configured to close the at least one load switch based on the power level.

17. A method comprising:
receiving a request for reconfiguration of a programmable logic device on an add in card;
determining a configuration profile for the programmable logic device based on the request;
receiving a signature field based on the configuration profile;
determining a power level associated with the configuration profile based on the signature field; and
adjusting one or more components of the add in card based on the power level.

18. The method of claim 17, comprising:
determining the power level is a low power level based on the signature field; and
disabling an inlet power feed based on the low power level.

19. The method of claim 17, determining a power level associated with the configuration profile based on the signature field comprising decoding the signature field.

20. The method of claim 17, comprising adjusting one or more voltage regulators of the add in card based on the power level.

* * * * *